(12) United States Patent
Lundberg (10) Patent No.: US 6,949,949 B2
(45) Date of Patent: Sep. 27, 2005

(54) APPARATUS AND METHOD FOR ADJUSTING THE IMPEDANCE OF AN OUTPUT DRIVER

(75) Inventor: James R. Lundberg, Austin, TX (US)

(73) Assignee: IP-First, LLC, Fremont, CA (US)

(*) Notice: Subject to any disclaimer, the term of this patent is extended or adjusted under 35 U.S.C. 154(b) by 51 days.

(21) Appl. No.: 10/730,425

(22) Filed: Dec. 5, 2003

(65) Prior Publication Data

US 2004/0113654 A1 Jun. 17, 2004

Related U.S. Application Data

(60) Provisional application No. 60/434,284, filed on Dec. 17, 2002.

(51) Int. Cl.[7] .............................................. H03K 17/16
(52) U.S. Cl. ............................ 326/30; 326/32; 326/33; 326/34
(58) Field of Search .............................. 326/26, 27, 30, 326/31, 32, 33, 34

(56) References Cited

U.S. PATENT DOCUMENTS

| | | | |
|---|---|---|---|
| 4,719,369 A | 1/1988 | Asano et al. | |
| 5,194,765 A | 3/1993 | Dunlop et al. | |
| 5,444,397 A | 8/1995 | Wong et al. | |
| 5,457,407 A | 10/1995 | Shu et al. | |
| 5,479,123 A | 12/1995 | Gist et al. | |
| 5,657,456 A | 8/1997 | Gist et al. | |
| 5,666,078 A | 9/1997 | Lamphier et al. | |
| 5,955,894 A | 9/1999 | Vishwanthalah et al. | |
| 6,087,847 A | 7/2000 | Mooney et al. | |
| 6,088,756 A | 7/2000 | Munoz-Bustamante | |
| 6,133,749 A | * 10/2000 | Hansen et al. | 326/30 |
| 6,163,499 A | 12/2000 | Suzuki | |
| 6,326,802 B1 | 12/2001 | Newman et al. | |
| 6,384,621 B1 | 5/2002 | Gibbs et al. | |
| 6,509,778 B2 | 1/2003 | Braceras et al. | |
| 6,624,662 B1 | 9/2003 | Volk | |
| 6,661,250 B2 | 12/2003 | Kim et al. | |
| 6,687,633 B2 | 12/2003 | Fifield et al. | |
| 6,690,211 B1 | 2/2004 | Huang et al. | |

* cited by examiner

*Primary Examiner*—Anh Q. Tran
(74) *Attorney, Agent, or Firm*—Gary R. Stanford; Richard K. Huffman; James W. Huffman (57) ABSTRACT

An output impedance bias compensation system for adjusting output impedance of at least one output including a reference impedance generator, an impedance matching controller, at least one output impedance generator, and a programmable bias controller. The reference impedance generator develops a reference impedance based on a reference value. The impedance matching controller continually adjusts an input of the reference impedance generator to match the reference value within a predetermined tolerance. Each output impedance generator is coupled to a corresponding output and is controlled by an output impedance control input. The programmable bias controller combines a bias amount with the value of the input of the reference impedance generator to provide the output impedance control input. The bias controller is programmable to provide a bias amount to compensate for any process variations between the reference impedance generator and each output impedance generator.

20 Claims, 7 Drawing Sheets

APPARATUS AND METHOD FOR ADJUSTING THE IMPEDANCE OF AN OUTPUT DRIVER

CROSS-REFERENCE TO RELATED APPLICATIONS

This application claims the benefit of U.S. Provisional Application No. 60/434,284, filed on Dec. 17, 2002, which is herein incorporated by reference for all intents and purposes.

This application is related to the following co-pending U.S. Patent Applications, which are filed on the same day as this application, which have a common assignee and at least one common inventor, and which are herein incorporated by reference in its entirety for all intents and purposes:

| Ser. No. | DOCKET NUMBER | TITLE |
| --- | --- | --- |
| 10/730,389 | CNTR.2116 | OUTPUT DRIVER IMPEDANCE CONTROLLER |
| 10/730,169 | CNTR.2117 | APPARATUS AND METHOD FOR PRECISELY CONTROLLING TERMINATION IMPEDANCE |

BACKGROUND OF THE INVENTION

1. Field of the Invention

The present invention relates to integrated circuit (IC) output driver circuits, and more particularly to a method and apparatus for adjusting the impedance of an output driver circuit to compensate for process variations across an IC.

2. Description of the Related Art

In earlier integrated circuit (IC) designs, CMOS output drivers were configured as push-pull elements. Consequently, the noise seen on an output bus fluctuated significantly in response to various factors, including circuit temperature, supply voltage, fabrication process differences, the number of devices on the bus, etc. In more recent years, as technological advances have resulted in the scaling of device size and voltage levels, designers have been forced to aggressively address noise problems on external buses in order to maximize the operating speed of circuits within a system. A bus typically includes one or more signal lines collectively routed on a system board or the like, where each signal line can be modeled as a transmission line subject to noise (e.g., reflections, cross-talk, etc.).

One aspect of more recent output driver solutions has been a move in the industry from push-pull output configurations to differential receiver configurations. In a differential receiver configuration, one side of a differential receiver is supplied with a reference voltage and the other side is driven by an open drain N-channel device. The open drain N-channel devices are provided on-chip and bus pull-up terminations are generally provided externally, typically on a system motherboard or the like. Providing pull-up terminations on a motherboard grants system designers a level of flexibility to address bus noise problems that has heretofore been unavailable.

The aforementioned types of output drivers have become prevalent within the industry. One particular example of this prevalence is exhibited by the Pentium® II x86 microprocessor, a product of Intel® Corporation. The Pentium II employs open drain N-channel output devices to drive a 1.5 Volt (V) bus having a 1.0 V reference threshold. Motherboards for this processor generally employ 56 ohm pull-up terminations. Although no particular pull down impedance has been specified, open drain output drivers have been used to comply with bus switching and timing specifications. Without compensating for process, voltage, and temperature variations, however, the channel resistance of an open drain N-channel output driver can vary anywhere from approximately 4 to approximately 80 ohms. And since microprocessor designers can only anticipate acceptable limits for process, voltage, and temperature fluctuations, they have been compelled in Pentium II motherboard-compatible designs to add slew rate controls on the order of 2–3 nanoseconds (ns) to output signal edges to reduce noise on output buses.

With the Pentium III®, Intel introduced a means whereby designers are provided with a reference impedance that can be used to set the impedance of the output drivers on the bus. A pin on the processor package, referred to as NCHCTRL, is connected to the bus voltage, referred to as VTT, through a precision 14 ohm resistor, with a maximum specified resistance of 16 ohms. The precision resistor is external to the microprocessor chip and is therefore independent of the temperature and voltage variations seen by output drivers on the chip. Thus, the external resistor is used as a reference for setting the pull-down impedance of open drain N-channel output drivers.

In addition, pull-up terminations for compatible configurations are to be provided on-chip rather than on the motherboard of a system. For the pull-up terminations, another pin referred to as RTT is provided, to which a precision resistor, R, may be connected between the pin and ground. The impedance across the precision resistor indicates the desired impedance for all pull-up terminations. Hence, a system designer is able to set the bus pull-up impedance for all of the signals on a part through one external resistor. By specification, the resistor can range from 40 to 130 ohms, thus enabling system designers to adjust the pull-up terminations on N-channel open drain buses to compensate for noise.

The related co-pending U.S. Patent Applications describe apparatus and methods for precisely controlling the pull-up or pull-down impedances of N-channel open drain bus signals. Exemplary embodiments of the inventions therein employ binary arrays of N- or P-channel devices as the termination elements. The number of devices that are turned on are determined by a replica binary array that is local to logic that monitors the reference impedances. If, however, there are process variations across a die that result in significant differences between the replica binary array and the output drivers or pull-up devices, then the number of devices that is determined for the reference array may not be a true optimum for the output arrays.

SUMMARY OF THE INVENTION

An output impedance bias compensation system for adjusting output impedance of at least one output according to an embodiment of the present invention includes a reference impedance generator, an impedance matching controller, at least one output impedance generator, and a programmable bias controller. The reference impedance generator develops a reference impedance controlled by a reference impedance control input. The impedance matching controller continually adjusts the reference impedance control input to match the reference impedance with a reference value within a predetermined tolerance. Each output impedance generator is coupled to a corresponding output and is controlled by an output impedance control input. The programmable bias controller combines a bias amount with the reference impedance control input to provide the output impedance control input.

In one embodiment, the bias controller includes output bias logic and bias adjustment logic. The output bias logic is programmable to provide the bias amount, and the bias adjustment logic combines the bias amount with the reference impedance control input to provide the output impedance control input. Any type of programmable non-volatile logic is contemplated for programming the bias amount, such as fuses, a non-volatile memory, etc. The bias amount may include a sign or polarity bit or may be a signed value that is added to the reference impedance control input. Alternatively, the bias amount is a percentage indicative of a percentage of the reference impedance control input that is added to or subtracted from the reference impedance control input.

An integrated circuit (IC) with output impedance adjustment according to an embodiment of the present invention includes a reference pin for coupling to an external reference resistor and at least one output pin, at least one programmable output impedance generator, and impedance matching logic. Each programmable output impedance generator is controlled by an output impedance control input and is coupled to an output pin. The impedance matching logic includes a programmable reference impedance generator controlled by a reference impedance control input, comparator logic, and output adjustment logic. The comparator logic periodically adjusts the reference impedance control input to equalize values of the reference resistor and the programmable reference impedance generator within a predetermined tolerance. The output adjustment logic combines the reference impedance control input with a bias adjustment value to provide the output impedance control input.

A method of adjusting output impedance of at least one output of an IC based on a reference impedance according to an embodiment of the present invention includes applying a reference voltage across the reference impedance and a reference impedance generator, adjusting a reference impedance input of the reference impedance generator to equalize impedances of the reference impedance generator and the reference impedance within a predetermined tolerance, measuring any difference between the reference impedance and at least one output impedance, programming a nonvolatile device on the IC with a bias adjust value to compensate for any measured difference, and combining the bias adjust value with the reference impedance input to provide an output impedance input of at least one output impedance generator coupled to a corresponding output.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for compensating for across-die process variations between a reference impedance generator and an output impedance generator including pull-up or pull-down devices. He has therefore developed an apparatus and method for adjusting the impedance of an output driver as will be further described below with respect to FIGS. 1–7.

Figure 1:
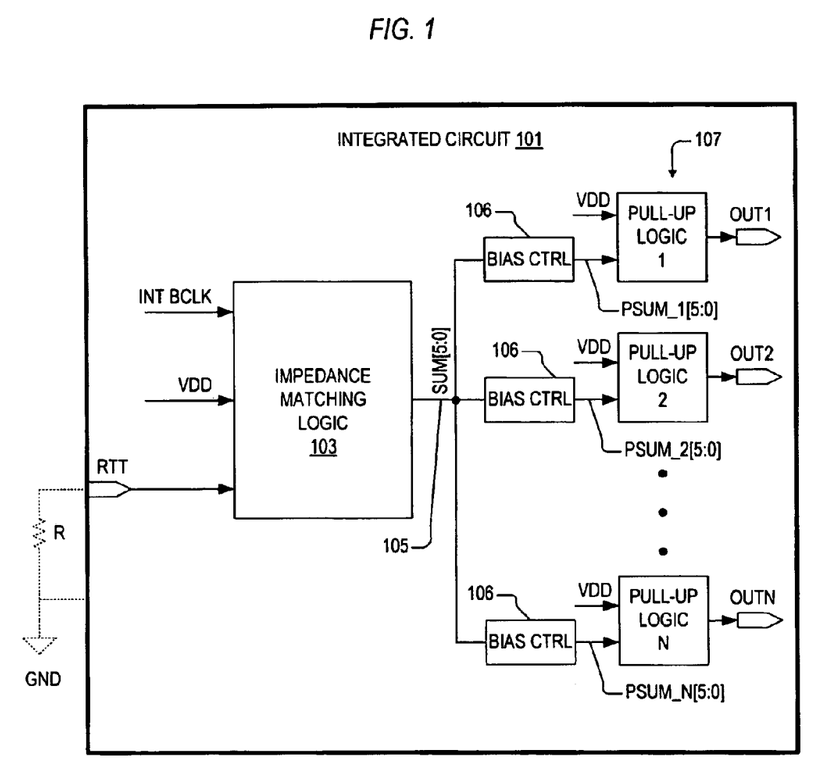
FIG. 1 is a simplified block diagram of an integrated circuit (IC) including an exemplary system for precisely controlling the termination impedance of a transmission line.

FIG. 1 is a simplified block diagram of an integrated circuit (IC) 101 including an system for precisely controlling the termination impedance of a transmission line. The IC 101 includes several externally-available input/output (I/O) pins, including a reference resistor pin RTT and multiple output pins, individually shown as OUT1, OUT2, . . . , OUTN, where N is a positive integer. A pin and the signal it carries are called by the same name unless otherwise specified. The IC 101 develops a voltage reference signal or otherwise receives voltage supply signal VDD. The VDD signal may be provided from an external pin relative to a ground (GND) pin (not shown). In the embodiment shown, a reference resistor R, shown in dashed lines, is externally coupled between pins RTT and ground. By specification, the resistor R ranges anywhere between 40 to 130 ohms and may be a precision resistor or the like (e.g., a 1% resistor), although the present invention is not limited to any specific value, range or resistor type.

Figure 2:
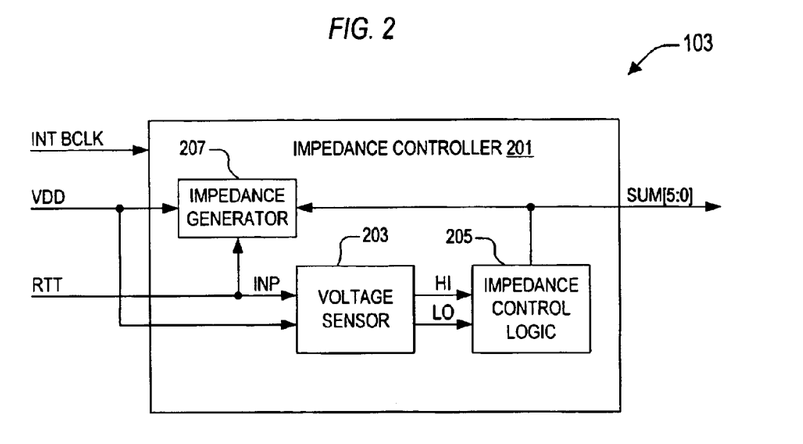
FIG. 2 is a more detailed block diagram of an exemplary embodiment of the impedance matching logic of FIG. 1.

The IC 101 includes impedance matching logic 103, which receives the VDD signal and which monitors the impedances of the reference resistor R and an internal impedance generator 207 (FIG. 2). In the embodiment shown, the impedance matching logic 103 monitors the voltage level of the RTT pin and provides a 6-bit digital value SUM[5:0] over a 6-bit internal bus 105 to multiple bias control logic elements 106, which are in turn coupled to corresponding termination or pull-up logic elements 107 (individually numbered from 1 to N) provided on the IC 101. Each of the individual pull-up logic elements 107 receives the VDD signal and is coupled to a corresponding one of the output pins OUTx (where "x" is any integer from 1 to N denoting a particular output pin). Within each of the pull-up logic elements 107, each bit of an adjusted SUM[5:0] value (i.e., PSUM_X[5:0]) enables/disables a corresponding group of an array of matched P-channel devices having a common drain point and employed to pull-up and terminate a corresponding OUTx pin. The PSUM_X[5:0] value specifies the number of P-channel devices that are to be turned on (or activated) within each of the pull-up logic elements 107 to pull-up and terminate the corresponding OUTx signal within a specified tolerance. In the embodiment shown, the PSUM_X[5:0] value allows for adjustment of the impedance of the pull-up logic devices 107 in 64 equally-spaced steps.

In operation, the impedance matching logic 103 maintains a local binary array of matched P-channel devices that is substantially identical to the binary array in each of the pull-up logic elements 107. Each of the arrays are organized or divided into binary groups for digital output impedance control, as further described below. The impedance of the local binary array within the impedance matching logic 103 is continually monitored and the SUM[5:0] value is periodically adjusted up or down so that the voltage across the internal array is within a predetermined tolerance of the voltage across the resistor R. In one embodiment, the predetermined tolerance is an error voltage of approximately 50 millivolts (mV). The optimum impedance of the pull-up logic elements 107 is determined or otherwise periodically updated on selected cycles of a bus clock, INT BCLK (e.g., every two INT BCLK cycles), and the SUM[5:0] value is propagated via the bus 105 to each of the bias control logic elements 106 to enable the pull-up logic elements 107 to be transparently updated.

The bias control logic elements 106 are provided to add or subtract bias to the SUM[5:0] value provided over the bus 105. This allows for an impedance adjustment to be implemented for each of the pull-up logic elements 107 to compensate for process variations across a die. In one embodiment, a bias controller 106 is provided for each pull-up logic element 107. In an alternative embodiment, a bias controller is provided for a local group of pull-up logic elements 107.

FIG. 2 is a more detailed block diagram of an exemplary embodiment of the impedance matching logic 103. The impedance matching logic 103 includes an impedance controller 201, which receives the INT BCLK, VDD and RTT signals. The impedance controller 201 includes a voltage sensor 203 which receives the VDD signal and which monitors the voltage of the RTT pin, shown locally as a signal INP. The INP signal is provided to the impedance generator 207, which presents an impedance between the VDD and INP signals based on a 6-bit input control value SUM[5:0]. The voltage sensor 203 effectively compares the voltages of the VDD and INP signals and generates signals HI and LO to impedance control logic 205 in an attempt to equalize the voltage levels across the impedance generator 207 and the resistor R within a predetermined tolerance. The impedance control logic 205 increments/decrements the SUM[5:0] value in response to the HI/LO signals to control the impedance of the impedance generator 207 until VDD–INP=INP within the predetermined error voltage (or so that the voltage of the INP signal is one-half the voltage of VDD within the predetermined error voltage). In other words, the voltage sensor 203 and the impedance control logic 205 cooperate in attempt to equalize the impedance (via voltage) of the impedance generator 207 with the impedance (via voltage) of the resistor R within the predetermined tolerance (via error voltage amount).

The VDD source voltage is divided by the resistor R and the impedance of the impedance generator 207 to provide an intermediate voltage of the INP signal. If the voltage of the INP signal is too high indicating that the impedance of the impedance generator 207 is too low (or less than the resistance of the resistor R), then the voltage sensor 203 asserts the HI signal and negates the LO signal. The impedance control logic 205 responds by decrementing the SUM[5:0] value to increase the impedance of the impedance generator 207. The voltage sensor 203 asserts the LO signal and negates the HI signal when the INP signal is too low indicating that the impedance of the impedance generator 207 is too high relative to the resistor R. The impedance control logic 205 responds by incrementing the SUM[5:0] value to decrease the impedance of the impedance generator 207. In the embodiment shown and described, the SUM[5:0] value is inversely proportional to the impedance of the impedance generator 207, although a proportional relationship is also contemplated.

In one embodiment, the voltage sensor 203 includes a pair of sense amplifiers (not shown) having voltage reference settings separated by the predetermined error voltage relative to one-half the voltage of VDD. In this case, a high sense amplifier has a set point of about one-half the error voltage above ½ VDD for controlling the HI signal and the low sense amplifier has a set point of one-half the error voltage below ½ VDD for controlling the LO signal. Each sense amplifier compares the voltage of the INP signal relative to its set point. If the voltage of the INP signal rises above one-half the error voltage, then HI is asserted, if INP falls below one-half the error voltage, then LO is asserted, and if INP is within one-half of the error voltage of ½ VDD, then neither HI or LO is asserted and no action is taken. In a more specific embodiment, the predetermined error voltage is approximately 50 mV so that the high sense amplifier is set to approximately 25 mV above ½ VDD while the low sense amplifier is set to approximately 25 mV below ½ VDD. The gap of the error voltage can be set for a tight tolerance for greater accuracy or otherwise set to a relatively wide tolerance to save power.

In one embodiment, the impedance control logic 205 is a digital circuit controlled by the INT BCLK signal, and adjusts (e.g., increments or decrements) the SUM[5:0] value during selected cycles of the INT BCLK signal, such as every clock cycle or every other clock cycle, etc.

Figure 3:
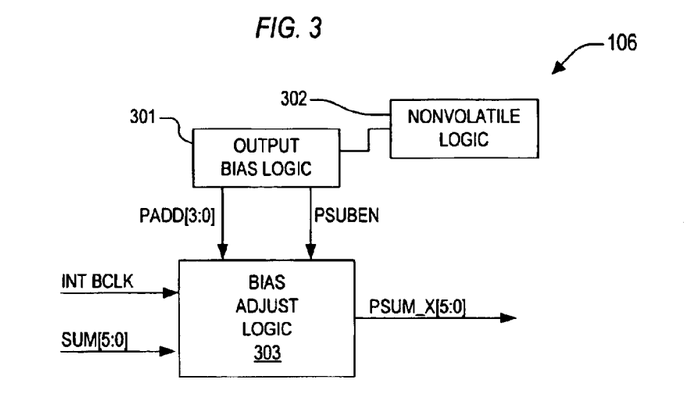
FIG. 3 is a more detailed block diagram of the bias control logic of FIG. 1.

Now turning to FIG. 3, a block diagram is presented illustrating a more detailed view of the bias control logic 106 of FIG. 1. The bias control logic 106 has nonvolatile logic 302 that is coupled to output bias logic 301. The output bias logic 301 is coupled to bias adjust logic 303 via signals PADD[3:0] and PSUBEN. Signals INT BCLK and SUM[5:0] are routed to the bias adjust logic 303, which produces corresponding signals PSUM_X[5:0] as shown in FIG. 1.

In operation, during selected cycles of the clock signal INT BCLK, such as every other clock cycle or the like, the bias adjustment logic 303 adjusts (e.g., increases or decreases) the PSUM_X[5:0] value based on the value of PADD[3:0] and the state of signal PSUBEN. The 4-bit value PADD[3:0] is provided from the output bias logic 301 to the bias adjust logic 303 to identify an amount to be added to or subtracted from the SUM[5:0] value. A sign or polarity signal PSUBEN provided by the output bias logic 301 to the bias adjust logic 303 determines whether the amount is to be added (when PSUBEN is not asserted) or subtracted (when PSUBEN is asserted). The PSUBEN signal and the PADD[3:0] value collectively form a signal bias adjust value. In one embodiment, the PADD[3:0] value is directly added to (e.g., when PSUBEN is logic 0 or not asserted) or otherwise directly subtracted from (e.g., when PSUBEN is logic 1 or asserted) the SUM[5:0] value. In this case, the PADD[3:0] value indicates a fixed amount of bias up to one-fourth the range of the SUM[5:0] value. In an alternative embodiment, the SUM[5:0] value is proportionally increased or decreased according to the value of PADD[3:0] and the PSUBEN signal. For example, if PADD[3:0] is set at 1000b (binary) and the PSUBEN signal is not asserted, then the SUM[5:0] is increased by 50 percent.

In a particular embodiment, the output bias logic 301 includes or is otherwise programmed by a programmable nonvolatile logic device 302 incorporated on the IC 101. Any type of nonvolatile programmable device is contemplated, such as any type of nonvolatile memory or a set of fuses or the like. For example, one or more fuses are blown or the bits of a nonvolatile memory device are set or programmed to establish the PADD[3:0] value and the PSUBEN signal. The programmed state of the device 302 is determined by a test procedure or the like on a part-by-part basis. In one embodiment, all but one bit of the device 302 corresponds to lower bits of SUM[5:0] value. In this manner, programming the device 302 allows a designer to increase or decrease the of SUM[5:0] value. Thus, the output bias logic 301 is a control mechanism that enables a designer to compensate for process variations across the IC 101.

Figure 4:
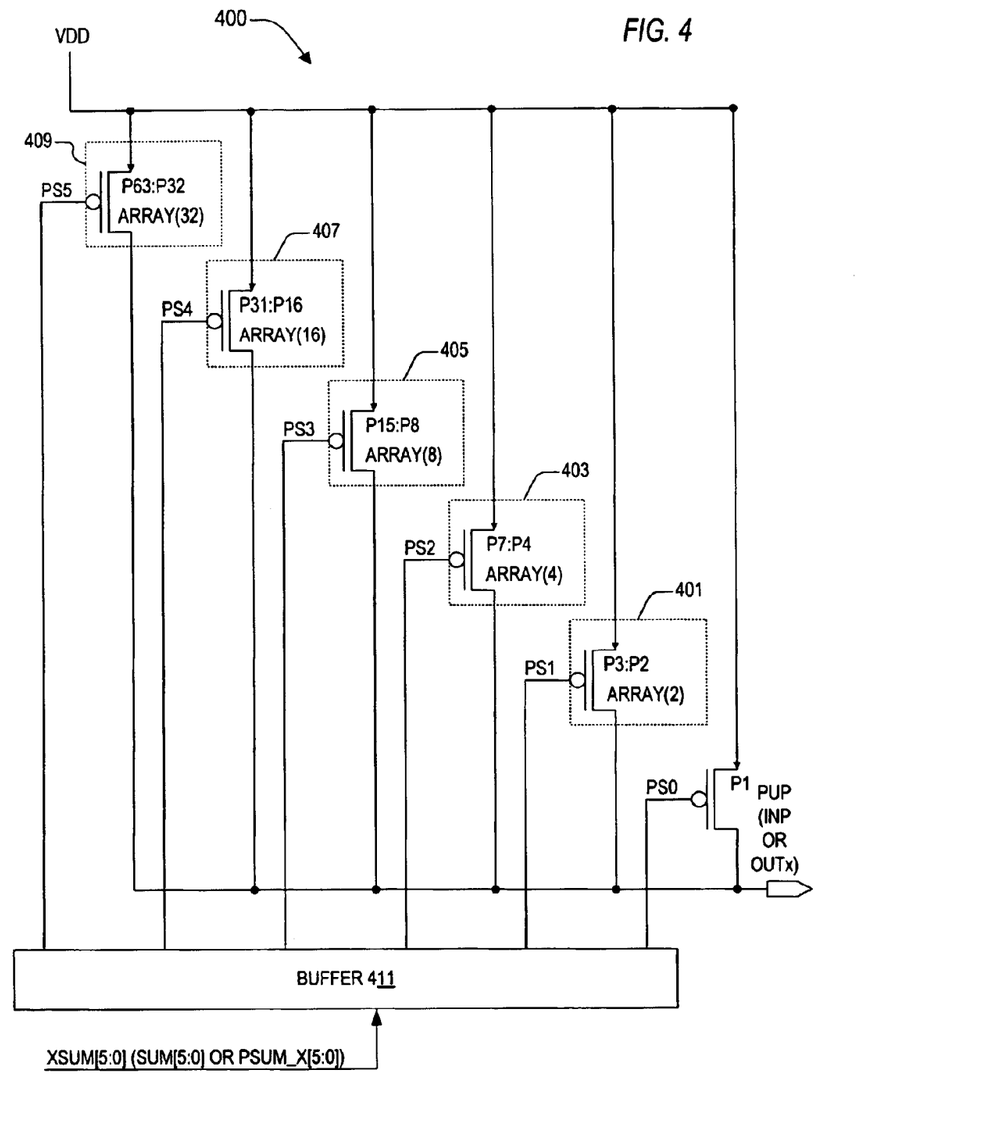
FIG. 4 is a more detailed schematic diagram of an exemplary embodiment of an impedance generator, which may be used to implement the impedance generator of FIG. 2 and/or to implement any of the pull-up logic elements of FIG. 1.

FIG. 4 is a schematic diagram of an exemplary embodiment of an impedance generator 400, which may be used to implement the impedance generator 207 and/or to implement any of the pull-up logic elements 107. The impedance generator 400 includes a binary array of 63 P-channel devices P1–P63 (or P63:P1). In one embodiment, each of the P-channel devices P63:P1 are matched so that the drain to source impedance is substantially the same. The source of each of the devices P63:P1 is coupled to VDD and the drain is coupled to a pull-up signal PUP, which represents the INP signal of the impedance generator 207 or the corresponding OUTx signal of any of the pull-up logic elements 107. The devices P63:P1 are binarily grouped to correspond to each of the six bits of a binary impedance value XSUM[5:0], which represents the SUM[5:0] value when implementing the impedance generator 207 or the PSUM_X[5:0] value when implementing any of the pull-up logic elements 107. A first array group is the sole device P1 having a gate which receives a signal PS0, a second array group 401 includes two devices P2 and P3 (P3:P2) each having gates receiving a signal PS1, a third array group 403 includes four devices P4–P7 (P7:P4) each having gates receiving a signal PS2, a fourth array group 405 includes eight devices P8–P15 (P15:P8) each having gates receiving a signal PS3, a fifth array group 407 includes 16 devices P16–P31 (P31:P16) each having gates receiving a signal PS4, and a sixth array group 409 includes 32 devices P32–P63 (P63:P31) each having gates receiving a signal PS5.

The PS5–PS0 signals collectively form a binary value asserted by a buffer 401, which receives the XSUM[5:0] value. Each of the PS5–PS0 signals is a buffered version of the corresponding bit of the XSUM[5:0] value. For example, the XSUM5 bit is buffered to generate the PS5 signal, the XSUM4 bit is buffered to generate the PS4 bit, and so on. Thus, as the XSUM[5:0] value is incremented or increased, the impedance between the VDD and PUP signals is decreased and vice-versa. For example, an XSUM[5:0] value of 100000b activates the array group 409 coupling approximately half (or 32) of the P-channel devices in parallel, while an XSUM[5:0] value of 100001b activates array groups P1 and 409 coupling 33 of the P-channel devices in parallel, while an XSUM[5:0] value of 100010b activates array groups 403 and 409 coupling 34 of the P-channel devices in parallel, and so on. An XSUM[5:0] value of 000000b turns off all of the P-channel devices for a high impedance state while a value of 111111b activates all 63 of the P-channel devices for the lowest impedance level. In one embodiment, the array of devices P63:P1 are sized and grouped to provide a pull-up impedance ranging from approximately 20 to 150 ohms for the expected range of operating temperatures and bus voltage conditions, leaving margin as well for anticipated fabrication process variations.

Figure 5:
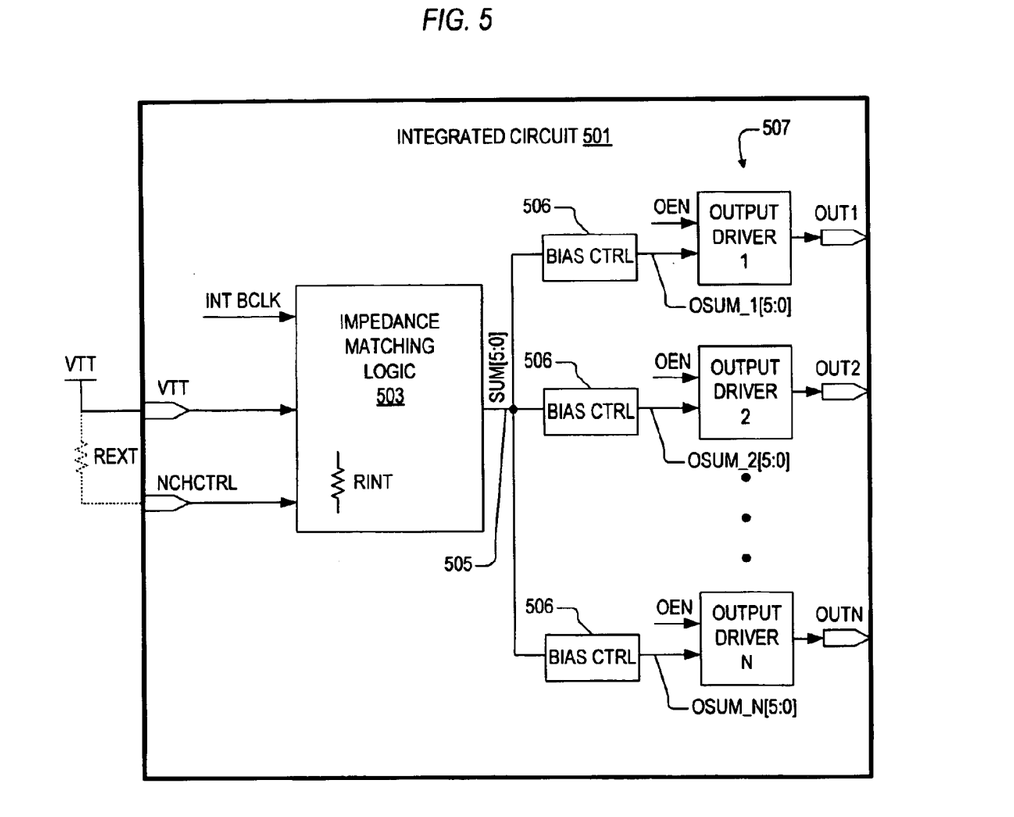
FIG. 5 is a simplified block diagram of another IC including an exemplary embodiment of an output driver impedance controller.

FIG. 5 is a simplified block diagram of another IC 501 including an exemplary embodiment of an output driver impedance controller. The IC 501 is similar to the IC 101 and the logic and circuitry of both may be provided on the same IC, if desired. The IC 501 also includes several externally-available I/O pins, including a bus voltage input pin VTT, an N-channel control pin NCHCTRL, and multiple output pins OUT1, OUT2, . . . , OUTN or OUTx as previously described. An external voltage signal VTT providing a reference bus voltage level is provided on pin VTT, such as, for example, 1.5 Volts (V). In one embodiment, an external reference resistor REXT, shown in dashed lines, is coupled between pins VTT and NCHCTRL. If the REXT resistor is not provided, then an internal resistor RINT is used instead as the default reference resistor. The resistor REXT assumed to be provided and the description of the resistor RINT is fully described in a related disclosure and will not be further described herein. In a specific embodiment, the REXT resistor is 14 ohms and may be a precision resistor or the like. In the specific embodiment, the RINT resistance is implemented as a silicon diffusion.

The IC 501 also includes impedance matching logic 503 which operates in a similar manner as the impedance matching logic 103 to monitor and compare the impedances of the reference resistor REXT and an internal impedance generator. In the embodiment shown, the impedance matching logic 503 monitors the voltage levels of the VTT and NCHCTRL pins, and provides a 6-bit digital value SUM [5:0] over a 6-bit internal bus 505 to multiple bias control logic elements 506, which are each coupled to corresponding output drivers 507 provided on the IC 401, where the output drivers 407 are individually numbered from 1 to N. Each of the individual output drivers 507 is coupled to a corresponding one of the output pins OUTx. Each output driver 507 is similar to each of the pull-up logic elements 107, and also includes an array of matched impedance devices, except that the devices are N-channel rather than P-channel to operate as pull-down devices rather than pull-up devices. In particular, within each of the output drivers 507, each bit of a value OSUM_X[5:0] enables/disables a corresponding group of an array of matched N-channel devices having a common drain point and employed to drive the corresponding OUTx pin. The OSUM_X[5:0] value is qualified by an output enable signal OEN having a state that is set according to the desired output state for that output driver. The OEN signal is provided by device logic (not shown) to set the state of the output signal of the corresponding output pin OUTx. The OSUM_X[5:0] value specifies the number of open drain N-channel devices that are to be turned on (or activated) within each of the output drivers 507 when the corresponding OUTx signal is a logic low. In one embodiment, the 6-bit bus 505 allows for adjustment of the impedance of the output drivers in 64 equally-spaced steps.

In operation, the impedance matching logic 503 maintains a local binary array of matched N-channel devices that is substantially identical to the binary array in each of the output drivers 507. Each of the arrays is organized or divided into binary groups for digital output impedance control in a similar manner as the arrays previously described for the IC 101. The impedance of the local binary array within the impedance matching logic 503 is continually monitored and the SUM[5:0] value is periodically adjusted up or down so that the voltage across the internal array is within a predetermined tolerance of the voltage across the selected reference resistor REXT (or the RINT resistor). In one embodiment, the predetermined tolerance is an error voltage of approximately 50 millivolts (mV). Also in a particular embodiment, the optimum impedance of the output drivers 507 is determined every two cycles of the INT BCLK signal, and the SUM[5:0] value is propagated via the bus 505 to each of the bias control logic elements 506 to enable the output drivers 507 to be transparently updated.

Just as described for IC 101, the IC 501 includes similar bias control logic elements 106 which are provided to add or subtract bias to the SUM[5:0] value provided over the bus 505. This allows for an impedance adjustment to be implemented for each of the output drivers 507 to compensate for process variations across a die. In one embodiment, a bias controller 506 is provided for each output driver 107 on the IC 501. In an alternative embodiment, a bias controller 506 is provided for a local group of output drivers 507 on the IC 501.

Figure 6:
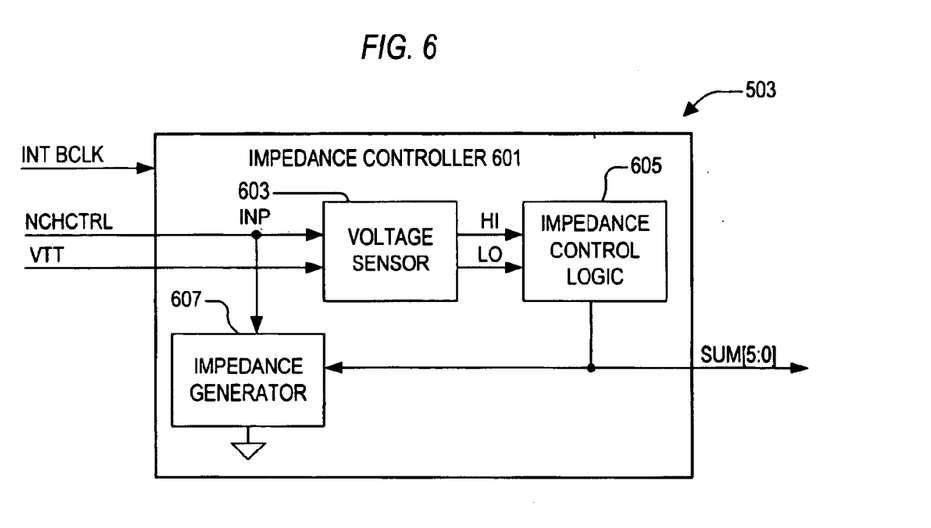
FIG. 6 is a more detailed block diagram of an exemplary embodiment of the impedance matching logic of FIG. 5.

FIG. 6 is a more detailed block diagram of an exemplary embodiment of the impedance matching logic 503. In the configuration shown, the impedance matching logic 503 is substantially similar in configuration and operation as the impedance matching logic 103 discussed with reference to FIG. 1. In a related disclosure, the impedance matching logic 503 is implemented in a slightly more complex manner to include a sense circuit that senses whether the REXT resistor is connected, and if not, that activates another, similar impedance controller that uses the resistor RINT as the reference resistor.

The impedance matching logic 503 includes an impedance controller 601, which receives the INT BCLK signal and which includes a voltage sensor 603 that monitors the voltage of the VTT and NCHCTRL pins. The NCHCTRL pin is shown providing a signal INP, which is provided to an impedance generator 607 referenced to ground. The impedance generator 607 presents an impedance between the INP signal and ground based on an input control value SUM [5:0]. The voltage sensor 603 effectively compares the voltage between the VTT and NCHCTRL pins with the voltage from the NCHCTRL pin to ground and generates signals HI and LO to impedance control logic 605 in an attempt to equalize the voltage levels within a predetermined tolerance. The impedance control logic 605 increments/decrements the SUM[5:0] value to control the impedance of the impedance generator 607 until VTT−INP=INP within the predetermined error voltage (or so that the voltage of the INP signal is one-half the voltage of VTT). In other words, assuming that the REXT resistor is externally coupled, the voltage sensor 603 and the impedance control logic 605 cooperate in attempt to equalize the voltage across the impedance generator 607 with the voltage across the REXT resistor within the predetermined error voltage.

When the REXT resistor is externally coupled, the VTT source voltage is divided by the REXT resistor and the impedance of the impedance generator 607 to provide a corresponding voltage on the INP signal. If the voltage of the INP signal is too high indicating that the impedance of the impedance generator 607 is too high (or greater than REXT), then the voltage sensor 603 asserts the HI signal and negates the LO signal. The impedance control logic 605 responds by incrementing the SUM[5:0] value to reduce the impedance value of the impedance generator 607. The voltage sensor 503 asserts the LO signal and negates the HI signal when the impedance of the impedance generator 607 is too low. The impedance control logic 605 responds by decrementing the SUM[5:0] value to increase the impedance value. In the embodiment shown and described, the SUM[5:0] value is inversely proportional to the impedance of the impedance generator 607, although a proportional relationship is also contemplated. In one embodiment, the voltage sensor 603 includes a pair of sense amplifiers (not shown) configured in substantially the same manner as describe above for the voltage sensor 203. Also, in one embodiment, the impedance control logic 605 is a digital circuit controlled by the INT BCLK signal, and adjusts (e.g., increments or decrements) the SUM[5:0] value during selected cycles of the INT BCLK signal, such as every clock cycle or every other clock cycle, etc.

Figure 7:
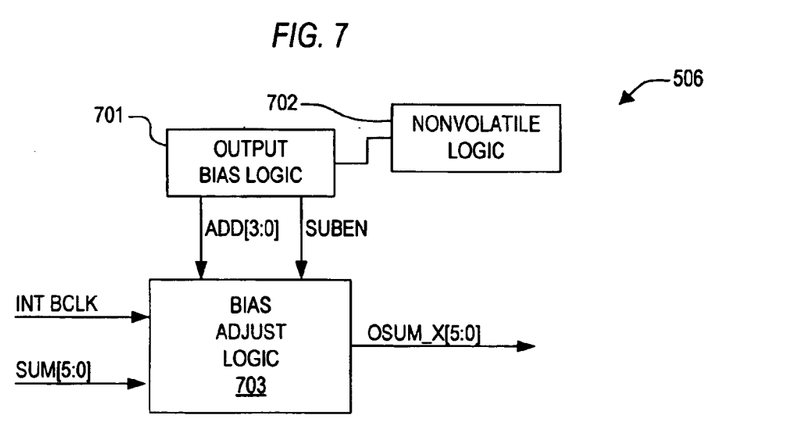
FIG. 7 is a more detailed block diagram of the bias control logic of FIG. 5.

Now turning to FIG. 7, a block diagram is presented illustrating a more detailed view of the bias control logic 506 of FIG. 5. The bias control logic 506 has nonvolatile logic 702 that is coupled to output bias logic 701. The output bias logic 701 is coupled to bias adjust logic 703 via signals ADD[3:0] and SUBEN. Signals INT BCLK and SUM[5:0] are routed to the bias adjust logic 703, which produces corresponding signals OSUM_X[5:0] as shown in FIG. 5.

In operation, during selected cycles of the clock signal INT BCLK, such as every other clock cycle or the like, the bias adjustment logic 703 adjusts (e.g., increases or decreases) the OSUM_X[5:0] value based on the value of ADD[3:0] and the state of signal SUBEN. The 4-bit value ADD[3:0] is provided from the output bias logic 701 to the bias adjust logic 303 to identify an amount to be added to or subtracted from the SUM[5:0] value. A sign or polarity signal SUBEN provided by the output bias logic 701 to the bias adjust logic 703 determines whether the amount is to be added (when SUBEN is not asserted) or subtracted (when SUBEN is asserted). The SUBEN signal and the ADD[3:0] value collectively form a signal bias adjust value. In one embodiment, the ADD[3:0] value is directly added to (e.g., when SUBEN is logic 0 or not asserted) or otherwise directly subtracted from (e.g., when SUBEN is logic 1 or asserted) the SUM[5:0] value. In this case, the ADD[3:0] value indicates a fixed amount of bias up to one-fourth the range of the SUM[5:0] value. In an alternative embodiment, the SUM[5:0] value is proportionally increased or decreased according to the value of ADD[3:0] and the SUBEN signal. For example, if ADD[3:0] is set at 1000b (binary) and the SUBEN signal is not asserted, then the SUM[5:0] is increased by 50 percent.

In a particular embodiment, the output bias logic 709 includes or is otherwise programmed by a programmable nonvolatile logic device 702 incorporated on the IC 501, such as a nonvolatile memory or fuses or the like. The output bias logic 701 and the programmable nonvolatile logic device 702 of the IC 501 are configured to operate in substantially the same manner as the output bias logic 301 and the programmable nonvolatile logic device 302 of the IC 101, and are not further described.

Figure 8:
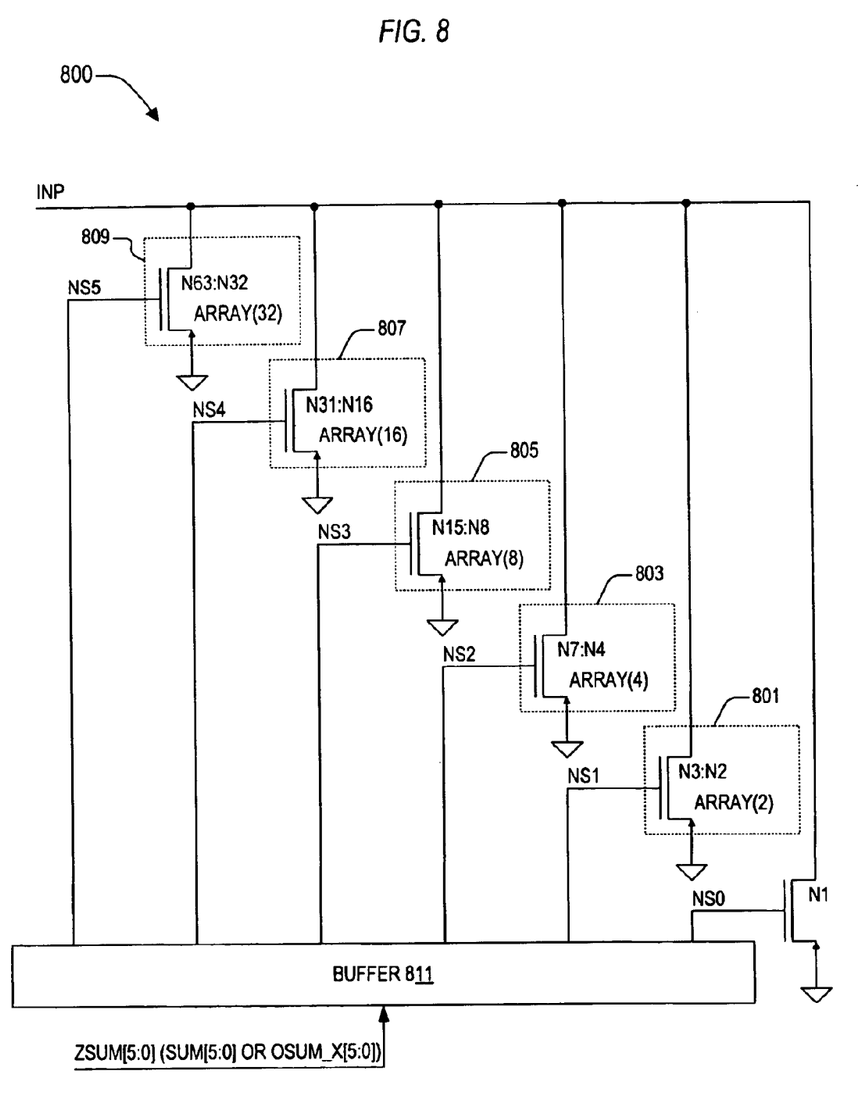
FIG. 8 is a schematic diagram of an exemplary embodiment of the impedance generator of FIG. 6, which may also be used with slight modification as impedance generators provided within the output drivers of FIG. 5.

FIG. 8 is a schematic diagram of an exemplary embodiment of an impedance generator 800 which may be used to implement the impedance generator 607 and/or to implement any of the output drivers 507. The impedance generator 800 includes a binary array of 63 N-channel devices N1–N63 (or N63:N1). In one embodiment, each of the N-channel devices N63:N1 are matched so that the drain to source impedance is substantially the same. The source of each of the devices N63:N1 is coupled to ground and its drain is coupled to a signal INP. The devices N63:N1 are binarily grouped to correspond to each of the six bits of a binary impedance value ZSUM[5:0]. A first array group is the sole device N1 having a gate which receives a signal NS0, a second array group 801 includes two devices N2 and N3 (N3:N2) each having gates receiving a signal NS1, a third array group 803 includes four devices N4–N7 (N7:N4) each having gates receiving a signal NS2, a fourth array group 805 includes eight devices N8–N15 (N15:N8) each having gates receiving a signal NS3, a fifth array group 807 includes 16 devices N16–N31 (N31:N16) each having gates receiving a signal NS4, and a sixth array group 809 includes 32 devices N32–N63 (N63:N31) each having gates receiving a signal NS5.

The NS5–NS0 signals form a binary value NS[5:0] asserted by a buffer 811, which receives a ZSUM[5:0] value. Each bit of the NS[5:0] value is a buffered version of the corresponding bit of the ZSUM[5:0] value. Thus, as the ZSUM[5:0] value is incremented or increased, the impedance of the INP signal is decreased and vice-versa. For example, a ZSUM[5:0] value of 100000b activates the array group 809 coupling approximately half (or 32) of the N-channel devices in parallel, while a ZSUM[5:0] value of 100001b activates array groups N1 and 809 coupling 33 of the N-channel devices in parallel, while a ZSUM[5:0] value of 100010b activates array groups 803 and 809 coupling 34 of the N-channel devices in parallel, and so on. A ZSUM[5:0] value of 000000b turns off all of the N-channel devices for a high impedance state while a value of 111111b activates all 63 of the N-channel devices for the lowest impedance level. In one embodiment, the array of devices N63:N1 are sized and grouped to provide a pull-down impedance ranging from approximately 4 to 24 ohms for the expected range of operating temperatures and bus voltage conditions, leaving margin as well for anticipated fabrication process variations.

Although not shown, the output drivers 507 may each be configured in a similar manner as the impedance generator 507. For each of the output drivers 507, the SUM[5:0] value is replaced with the OSUM[5:0] value, and additional logic, such as an array of AND gates or the like, is provided to combine the OEN signal with each of the NS5–NS0 signals as described in the related disclosure. In this manner, the IC 501 is configured in a similar manner as the IC 101, where each output driver 507 includes a binary array of matched impedance devices that are matched with the reference binary array of matched impedance devices provided in the impedance generator 607.

The IC 101 is described using matched P-channel pull-up devices whereas the IC 501 is described using matched N-channel pull down devices. In either case, an impedance controller (e.g., 201, 601) modifies a digital value (e.g., SUM[5:0]) in an attempt to match the impedance of an impedance generator (e.g., 207, 607) with a reference device (e.g., R, REXT), where the digital value is then used to set the impedance of similar impedance generators provided in output devices coupled to output pins of the respective IC. The impedance of the reference impedance generator of the impedance matching logic (e.g., 103, 503) is intended to match the impedance of each impedance generator of the output devices (e.g., 107, 507). If there are process variations across a die that result in significant differences between the replica binary array and the output devices, then the number of impedance devices that is determined for the reference array may not be the optimal number for the output devices.

The output bias logic (e.g., 301, 701) and the bias adjustment logic (e.g., 303, 703) provide a control mechanism to enable a designer to compensate for these process variations across the chip by distributing these elements within a bias control logic element 106, 506 that is local to a given pull-up element or output driver (or a group of pull-up elements or output drivers). For example, after fabrication, the designer places the IC into a test set (not shown) which couples the IC to a reference impedance (e.g., R or REXT). The test set measures any differences between the reference impedance and the resulting impedance (pull-up or pull down) at the outputs to identify an error or bias offset. The designer programs the output bias logic (e.g., 301, 701) accordingly to remove the error to compensate for process variations on the chip.

Figure 9:
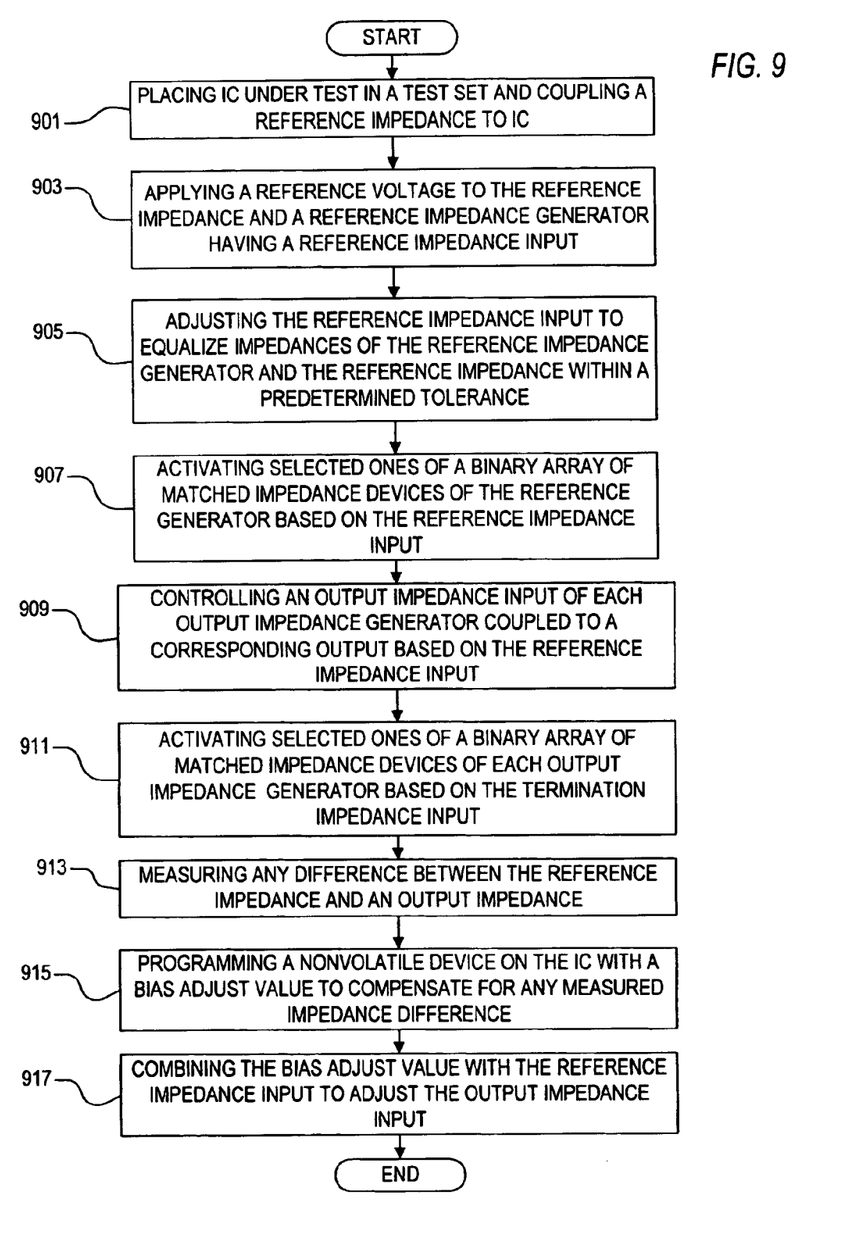
FIG. 9 is a flowchart diagram illustrating a method of adjusting the output impedance of at least one output of an IC based on a reference impedance according to an exemplary embodiment of the present invention.

FIG. 9 is a flowchart diagram illustrating a method of adjusting the output impedance of at least one output of an IC based on a reference impedance according to an exemplary embodiment of the present invention. At first block 901, the IC under test is placed into a test set or the like for performing a test procedure, and a reference impedance (e.g., reference resistors R, REXT) is externally coupled if necessary or desired. Note that if the reference resistor RINT is internally provided, then it may be used as the reference impedance. At next block 903, after the IC is powered up and begins operating, it applies a reference voltage to the reference impedance and to the reference impedance generator. In the embodiments illustrated, the reference voltage may be a voltage source, such as the VDD signal or the like, which is applied across the reference resistance and the reference impedance coupled in series.

At next block 905, the IC adjusts a reference impedance input of the reference generator to equalize impedance of the reference impedance generator with the reference resistance within a predetermined tolerance. In the illustrated embodiments, a voltage is sensed at an intermediate junction between the reference impedance and the reference impedance generator and compared with a percentage of the reference voltage (e.g., VDD or VTT). Also, the reference impedance input is periodically or otherwise continuously adjusted to keep within the predetermined tolerance. At next block 907, selected ones of a binary array of matched impedance devices of the reference impedance generator are activated internally by the IC based on the reference impedance input. In the illustrated embodiment, the reference impedance input is a digital value in which each bit activates a selected group of an array of matched impedance devices, which may be N-channel or P-channel devices.

At next block 909, the output impedance input provided to each output impedance generator coupled to a corresponding output is controlled by the IC based on the reference impedance input. At next block 911, selected ones of a binary array of matched impedance devices of each output impedance generator are activated based on the output impedance input. In this manner, the IC attempts to adjust the impedance of its outputs in accordance with the reference impedance. As previously described, each of the pull-up logic elements 907 and/or each of the output drivers 907 includes the same configuration of matched impedance devices as the reference impedance generator, so that the output termination impedance of each output is based on the reference impedance.

At next block 913, any difference between the reference impedance and at least one output impedance is measured. This may be done automatically by the test set or manually by the test operator. Alternatively, if the resistor RINT is employed as the reference resistance during test, then the measured output impedance is compared with the known value or desired value of the output pull-up and/or pull down impedances. At next block 915, a nonvolatile device associated with the measured output impedance on the IC is programmed with a bias adjust value to compensate for any measured impedance difference. In the specific embodiments described, the bits of a nonvolatile memory device are set or selected fuses incorporated on the IC are blown to provide a control mechanism to compensate for process variations across the IC. At next block 917, the IC combines the bias adjust value with the reference impedance input to adjust the output impedance input. In the illustrated embodiments, the bias adjustment logic (303, 703) incorporates (adds, subtracts, or otherwise combines) the ADD[3:0] value or the PADD[3:0] value to the SUM[5:0] value to generate the OSUM_X[5:0] value or the PSUM_X[5:0] value, respectively, which is routed to each of the output devices (e.g., pull-up logic devices 107 or output drivers 507). The test procedure may be repeated again to ensure proper compensation and to generate different compensation values of PSUM_X[5:0] and OSUM_X[5:0] that correspond to pull-up elements 107 or output drivers 507 which are on different areas of the IC 101, 501.

The impedance controller continuously adjusts the output impedance (bus pull-down impedance for output drivers or pull-up termination impedances) of each selected output device (or device grouping) of an IC during operation in a transparent manner. An apparatus and method for adjusting the impedance of an output driver according to an embodiment of the present invention enables a system designer to adjust the impedance to compensate for process variations across the IC. Programmable non-volatile logic devices, such as a non-volatile memory or fuses or the like, are provided on the chip to enable programming each of the bias adjust values. Each of the bias adjust values is used by their associated bias adjust logic elements to provide the desired compensation.

Although the present invention has been described in considerable detail with reference to certain preferred versions thereof, other versions and variations are possible and contemplated. For example, various alternative methods are contemplated for equalizing impedance of the programmable impedance generator with the reference impedance, such as current techniques or the like. Also, any type of non-volatile programmable means is contemplated for programming the compensation. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An output impedance bias compensation system for adjusting output impedance of at least one output, comprising:
    a reference impedance generator that develops a reference impedance controlled by a reference impedance control input;
    an impedance matching controller that continually adjusts said reference impedance control input to match said reference impedance with a reference value within a predetermined tolerance;
    at least one output impedance generator, each coupled to a corresponding output and controlled by an output impedance control input; and
    a programmable bias controller that combines a bias amount with said reference impedance control input to provide said output impedance control input.

2. The output impedance bias compensation system of claim 1, wherein said bias controller comprises:
    output bias logic that is programmable to provide said bias amount; and
    bias adjustment logic, coupled to said output bias logic and said impedance matching controller, that combines said bias amount with said reference impedance control input to provide said output impedance control input.

3. The output impedance bias compensation system of claim 2, wherein said output bias logic comprises a plurality of fuses.

4. The output impedance bias compensation system of claim 2, wherein said output bias logic comprises a programmable non-volatile logic device.

5. The output impedance bias compensation system of claim 2, wherein said bias amount comprises a signed bias value that is added to said reference impedance control input.

6. The output impedance bias compensation system of claim 2, wherein said bias amount comprises a signed percentage value indicative of a percentage of said reference impedance control input, and wherein said signed percentage value is added to said reference impedance control input.

7. The output impedance bias compensation system of claim 1, wherein said programmable reference impedance generator and each of said at least one programmable output impedance generator each comprise a binary array of matched devices.

8. The output impedance bias compensation system of claim 7, wherein said binary array of matched devices comprises matched P-channel pull-up devices.

9. The output impedance bias compensation system of claim 7, wherein said binary array of matched devices comprises matched N-channel pull-down devices.

10. An integrated circuit (IC) with output impedance adjustment, comprising:
    a plurality of pins including a reference pin for coupling to an external reference resistor and at least one output pin;
    at least one programmable output impedance generator, each controlled by an output impedance control input and coupled to a corresponding one of said at least one output pin; and
    impedance matching logic, comprising:
        a programmable reference impedance generator controlled by a reference impedance control input;
        comparator logic that periodically adjusts said reference impedance control input to equalize values of said reference resistor and said programmable reference impedance generator within a predetermined tolerance; and
        output adjustment logic that combines said reference impedance control input with a bias adjustment value to provide said output impedance control input.

11. The IC of claim 10, wherein said output adjustment logic comprises a plurality of programmable fuses.

12. The IC of claim 10, wherein said output adjustment logic comprises a programmable non-volatile logic device.

13. The IC of claim 10, wherein said programmable reference impedance generator and each said programmable output impedance generator comprises a binary array of matched impedance devices.

14. The IC of claim 10, wherein said bias adjustment value is added to or subtracted from said reference impedance control input.

15. The IC of claim 10, wherein said bias adjustment value comprises a percentage value indicative of a percentage of said reference impedance control input that is added to or subtracted from said reference impedance control input.

16. A method of adjusting output impedance of at least one output of an IC based on a reference impedance, comprising:

applying a reference voltage across the reference impedance and a reference impedance generator, the reference impedance generator having a reference impedance input;

adjusting the reference impedance input to equalize impedances of the reference impedance generator and the reference impedance within a predetermined tolerance;

measuring any difference between the reference impedance and at least one output impedance;

programming a nonvolatile device on the IC with a bias adjust value to compensate for any measured difference; and combining the bias adjust value with the reference impedance input to provide an output impedance input of at least one output impedance generator, each output impedance generator coupled to a corresponding output.

17. The method of claim 16, wherein said programming a bias adjust value comprises blowing at least one fuse.

18. The method of claim 16, wherein said programming a bias adjust value comprises programming at least one bit of a non-volatile memory.

19. The method of claim 16, wherein said bias adjust value comprises a signed bias value, and wherein said combining the bias adjust value with the reference impedance input comprises adding the signed bias value.

20. The method of claim 16, wherein said bias adjust value comprises a percentage value indicative of a percentage of the reference impedance input and a polarity signal, and wherein said combining the bias adjust value with the reference impedance input comprises adding the percentage to or subtracting the percentage from the reference impedance input based on the polarity signal.

* * * * *